(12) United States Patent  
Suekawa

(10) Patent No.: US 8,450,828 B2  
(45) Date of Patent: May 28, 2013

(54) SEMICONDUCTOR DEVICE

(75) Inventor: Eisuke Suekawa, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 613 days.

(21) Appl. No.: 12/339,702

(22) Filed: Dec. 19, 2008

(65) Prior Publication Data

US 2010/0025820 A1 Feb. 4, 2010

(30) Foreign Application Priority Data

Jul. 29, 2008 (JP) .................................. 2008-195062

(51) Int. Cl.
*H01L 29/66* (2006.01)
*H01L 29/06* (2006.01)

(52) U.S. Cl.
CPC ........ *H01L 29/0619* (2013.01); *H01L 29/0623* (2013.01)
USPC ...... 257/484; 257/355; 257/173; 257/E29.02; 257/E29.013

(58) Field of Classification Search
CPC ..................................................... H01L 29/66
USPC ............ 257/355, 173, 356, E29.01, E29.013, 257/127, 401, 409, 452, 484, E29.02, 490, 257/494, 495, 605, 500, 578, 691, E29.027, 257/E29.197, E21.382, E29.257, E21.418; 438/48, 140, 284, 286, 454, 570
See application file for complete search history.

(56) References Cited

U.S. PATENT DOCUMENTS

| 4,080,619 A | * | 3/1978 | Suzuki .......................... 257/591 |
| 5,374,843 A | * | 12/1994 | Williams et al. .............. 257/492 |
| 5,677,562 A | * | 10/1997 | Korwin-Pawlowski et al. ............................. 257/490 |

(Continued)

FOREIGN PATENT DOCUMENTS

EP 0 115 093 A2 8/1984
JP 59-036932 A 2/1984

(Continued)

OTHER PUBLICATIONS

"Power Semiconductor Device and Power IC Handbook", the Institute of Electrical Engineers of Japan, Corona Publising Co., Ltd., 1996, 5 pages (with partial English Translation).

(Continued)

*Primary Examiner* — Cuong Q Nguyen
*Assistant Examiner* — Yosef Gebreyesus
(74) *Attorney, Agent, or Firm* — Oblon, Spivak, McClelland, Maier & Neustadt, L.L.P.

(57) ABSTRACT

A semiconductor device includes a semiconductor substrate of a first conductivity type, including a first main surface and a second main surface opposite to each other. A power semiconductor element includes a first electrode in a first region at the first main surface of the semiconductor substrate, and a second electrode at the second main surface. A current flows between the first electrode and the second electrode. The semiconductor device also includes a guard ring of a second conductivity type, in a second region at the first main surface, at a more outer circumference than the first region. A semi-insulating insulation film covers the second region. A dielectric film in the second region covers the semi-insulating insulation film. A flow block portion in a third region at the first main surface, at a more outer circumference than the second region, prevents a flow out of the dielectric film.

11 Claims, 17 Drawing Sheets

U.S. PATENT DOCUMENTS

| | | | |
|---|---|---|---|
| 6,429,501 B1 * | 8/2002 | Tsuchitani et al. | 257/493 |
| 6,440,574 B2 * | 8/2002 | Lefranc | 428/469 |
| 2004/0195620 A1 * | 10/2004 | Chuang et al. | 257/335 |
| 2006/0211227 A1 * | 9/2006 | Chen et al. | 438/570 |
| 2006/0255379 A1 * | 11/2006 | Veeramma | 257/288 |
| 2007/0052014 A1 * | 3/2007 | Takahashi | 257/330 |
| 2007/0222019 A1 * | 9/2007 | Rochefort et al. | 257/493 |

FOREIGN PATENT DOCUMENTS

| | | |
|---|---|---|
| JP | 60-102770 A | 6/1985 |
| JP | 3-116785 A | 5/1991 |
| JP | 3-116976 | 5/1991 |
| JP | 4-212468 | 8/1992 |
| JP | 6-97469 | 4/1994 |
| JP | 7-326744 A | 12/1995 |
| JP | 2000-260985 A | 9/2000 |
| JP | 2004-349383 A | 12/2004 |
| JP | 2007-201247 A | 8/2007 |
| JP | 2007-258710 A | 10/2007 |

OTHER PUBLICATIONS

Japanese Office Action mailed Jan. 22, 2013, in Japanese Patent Application No. 2008-195062.

* cited by examiner

SEMICONDUCTOR DEVICE

BACKGROUND OF THE INVENTION

1. Field of the Invention

The present invention relates to semiconductor devices, particularly to a power semiconductor device.

2. Description of the Background Art

In a power semiconductor device including a semiconductor element such as an IGBT (Insulated Gate Bipolar Transistor), an outer circumferential junction region such as a guard ring is formed to surround the IGBT for the purpose of rendering the main breakdown voltage characteristics stable. This formation of an outer circumferential junction region causes the depletion layer to spread to the outer circumferential junction region when voltage is applied across the collector and emitter to alleviate the electric field strength at the pn junction of the emitter region. Accordingly, the collector-emitter current ($I_{CES}$) and collector-emitter voltage ($V_{CES}$) become stable.

Moreover, a semi-insulating silicon nitride film is formed on the outer circumferential junction region for the purpose of stabilizing the potential distribution at the outer circumferential junction region. This formation of a semi-insulating silicon nitride film of high resistance on the outer circumferential junction region (guard ring) will cause the flow of a small current at the semi-insulating silicon nitride film when voltage is applied across the collector and emitter of the IGBT. Accordingly, the potential at the region between respective portions of the guard ring located along the outer circumferential region is fixed, rendering the potential distribution at the outer circumferential junction region stable. A semi-insulating silicon nitride film is also expressed as a sinSiN film. A power semiconductor device including the semi-insulating silicon nitride film is disclosed in, for example, "Power Semiconductor Device and Power IC Handbook", edited by The Institute of Electrical Engineers of Japan, CORONA PUBLISHING CO. LTD., 1996 (Non-Patent Document 1).

In general, a chip on which a power semiconductor element such as an IGBT or diode is provided is incorporated into a power module to be used for a power semiconductor device. In a power module, the power semiconductor device is sealed with silicone gel and the like. Application of voltage across the collector and emitter causes the plus ions and minus ions of the impurity ions in the silicone gel to gather at the ground side and the high potential side, respectively, to develop polarization.

By this polarization, the distribution of the electric field strength at the outer circumferential junction region is altered, leading to the possibility of unstable main breakdown voltage characteristics such as the collector-emitter current ($I_{CES}$) and collector-emitter voltage ($V_{CES}$).

Particularly, a power semiconductor device having a rated voltage that exceeds 6 kV is readily affected by impurities ions since the electric field strength according to the voltage applied across the collector and emitter is high. It was sometimes difficult to render the main breakdown voltage characteristics stable for such a power semiconductor device as compared to a power semiconductor device that has a relatively low rated voltage.

SUMMARY OF THE INVENTION

In view of the foregoing, an object of the present invention is to provide a semiconductor device directed to stabilizing the main breakdown voltage characteristics.

A semiconductor device according to the present invention includes a semiconductor substrate of a first conductivity type, a power semiconductor element, a guard ring of a second conductivity type, a semi-insulating insulation film, a dielectric film, and a flow block portion. The semiconductor substrate of the first conductivity type includes a first main surface and a second main surface opposite to each other. The power semiconductor element includes a first electrode formed in a first region at the first main surface and a second electrode formed at the second main surface of the semiconductor substrate. Current flows across the first and second electrodes. The guard ring of the second conductivity type is formed at the first main surface in a second region located at an outer side than the first region. The semi-insulating insulation film is formed to cover the second region. The dielectric film is formed in the second region so as to cover the semi-insulating insulation film. The flow block portion is formed in a third region at the first main surface located at an outer side than the second region to prevent the material that will constitute the dielectric film from flowing out.

By virtue of the formation of a flow block portion in the semiconductor device of the present invention, the flow out of the supplied material towards the side outer than the third region during a supply of the material that will constitute the dielectric film can be prevented. Accordingly, a dielectric film of a desired thickness can be formed in the second region to prevent the main breakdown voltage characteristics from being degraded.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
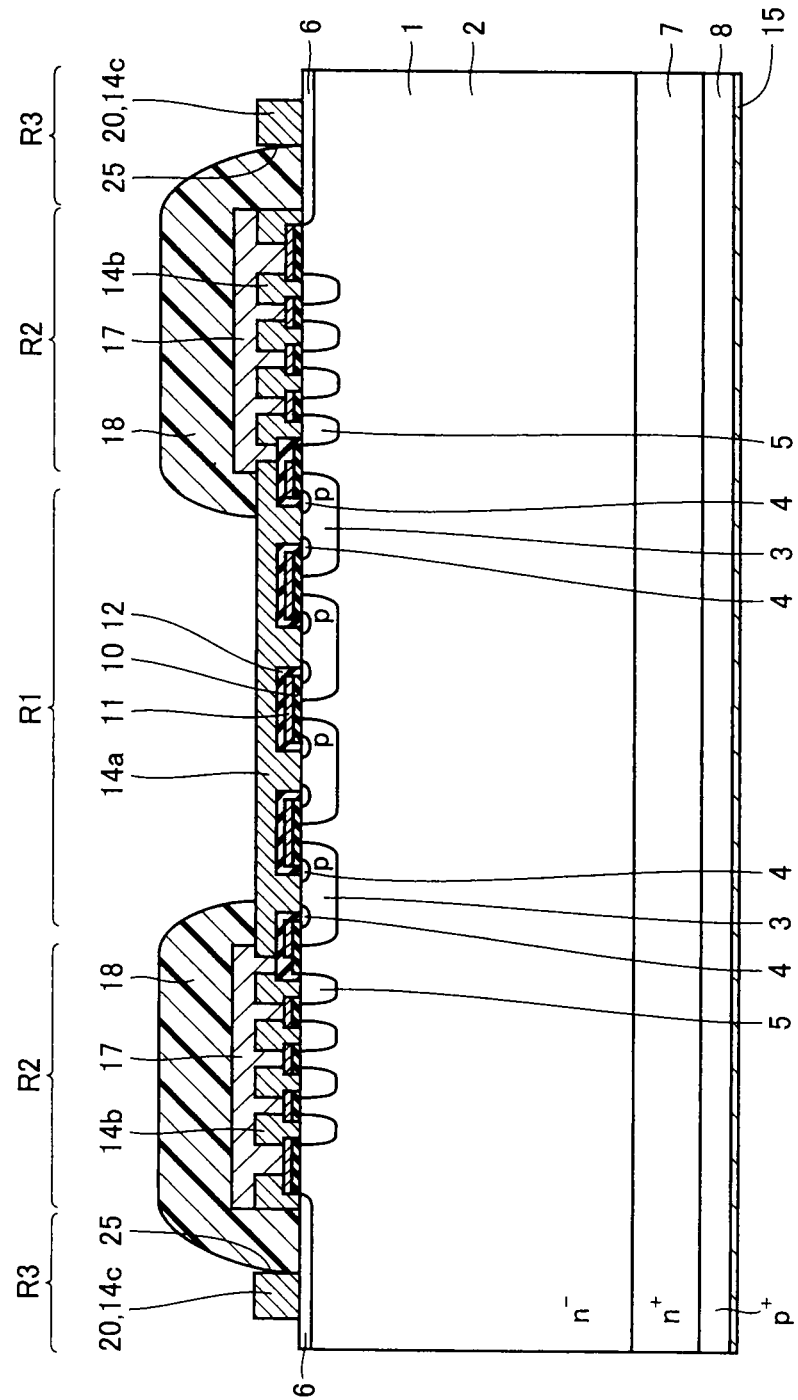
FIG. 1 is a sectional view of a semiconductor device according to a first embodiment of the present invention.

A power semiconductor device including an IGBT as a power semiconductor element will be described by way of example. Referring to FIG. 1, an emitter electrode 14a and a gate electrode 11 of an IGBT are formed in a first region R1 at a first main surface of an n type semiconductor substrate 1. A collector electrode 15 of the IGBT is formed at a second main surface. In first region R1, a p base layer 3 is formed, extending to a predetermined depth from the surface. Furthermore, an n source layer 4 is formed in p base layer 3, extending from the surface of p base layer 3. Gate electrode 11 is formed above the n type region (n drift layer 2) of semiconductor substrate 1, located between p base layers 3, with silicon oxide film 10 thereunder. Above gate electrode 11 is formed an emitter electrode 14a with an interlayer insulation film 12 thereunder. An emitter electrode 14a is formed on gate electrode 11 with an interlayer insulation film 12 thereunder.

At the first main surface of semiconductor substrate 1, a second region R2 qualified as an outer circumferential junction region is provided to surround first region R1. A p layer 5 qualified as a guard ring is formed in second region R2, extending to a predetermined depth from the surface. An AlSi layer 14b is formed so as to be brought into contact with p layer 5. A semi-insulating silicon nitride film 17 is formed so as to cover AlSi layer 14b. An n layer 6 is formed at the surface in a third region of semiconductor substrate 1, located at an outer side than second region R2. On n layer 6 is formed an AlSi layer 14c constituting a stepped portion 20, spaced apart from AlSi layer 14b located at the outermost circumferential side.

In the present semiconductor device, an over coat film 18 such as of polyimide, for example, serving as a film to alleviate the electric field strength caused by polarization, is formed in second region R2 so as to cover semi-insulating silicon nitride film 17. AlSi layer 14c serves to prevent the over coat material such as polyimide from flowing outwards during the step of applying over coat film 18. An n+ buffer layer 7 and a p+ collector layer 8 are formed at the second main surface side of semiconductor substrate 1. Collector electrode 15 is formed at the surface of p+ collector layer 8. A diced chip 50 is mounted on a predetermined substrate 57, and sealed with a sealing gel 55 (refer to FIG. 10).

The semiconductor device set forth above has over coat film 18 formed so as to cover semi-insulating silicon nitride film 17. Accordingly, the event of the collector-emitter current ($I_{CES}$) and collector-emitter voltage ($V_{CES}$) characteristics becoming unstable as a result of polarization of the impurity ions in the sealing gel can be prevented. This will be described in detail hereinafter, first based on a semiconductor device without an over coat film.

Figure 2:
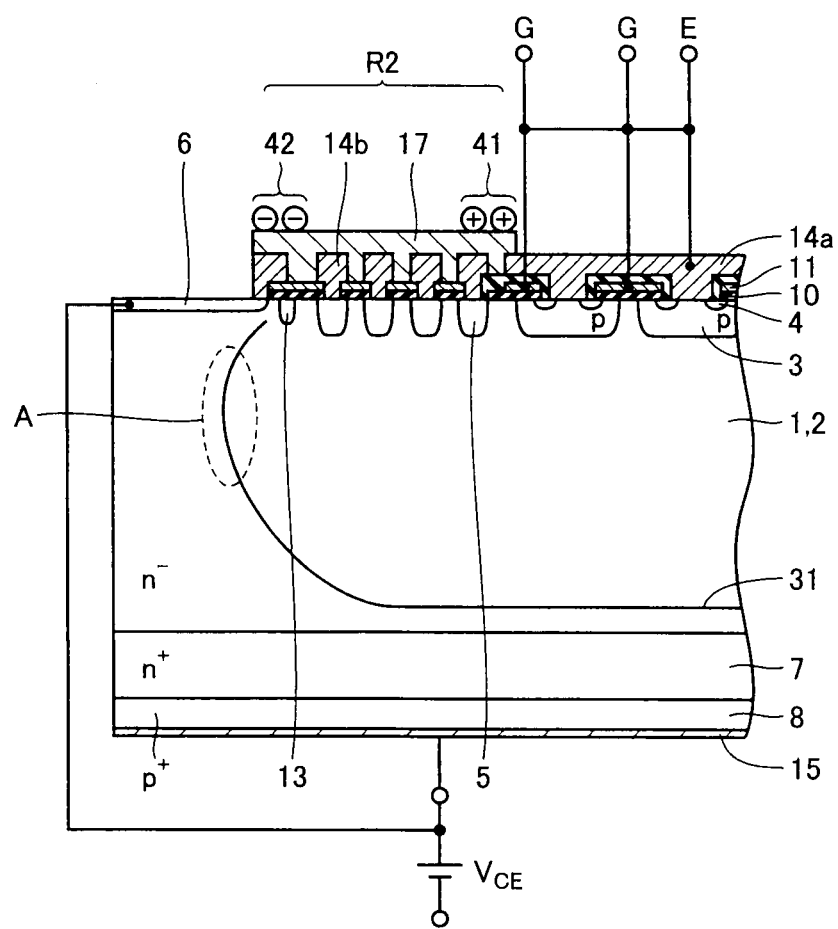
FIGS. 2 and 3 are first and second partial sectional views, respectively, to describe an advantage of the semiconductor device of the first embodiment.

Referring to FIG. 2, a predetermined voltage is applied between collector electrode 15 and emitter electrode 14a for evaluating the breakdown voltage of the semiconductor device. This breakdown voltage corresponds to an OFF state, and a breakdown voltage corresponding to the rated voltage of the semiconductor device must be ensured. In the case of a semiconductor device having the rated voltage of 6.5 kV, 4.5 kV and 3.3 kV, a voltage of 6.5 kV, 4.5 kV, and 3.3 kV, respectively, will be applied between collector electrode 15 and emitter electrode 14a.

At this stage, collector electrode 15 and n layer 6 are connector to the high potential side whereas emitter electrode 14a and the like are connected to the ground potential (GND) side. N layer 6 is located in third region R3 that is outer than second region R2 where p layer 5 qualified as a guard ring is formed. Emitter electrode 14a and the like are located in first region R1 that is inner than second region R2.

Attention is drawn to the surface of semi-insulating silicon nitride film 17 formed in second region R2. Plus ions 41 and minus ions 42 of the impurity ions in the sealing gel gather above the surface of the inner side region and the outer side region surface, respectively, resulting in the development of polarization by impurity ions. By the effect of minus ions 42 gathering above p layer 5 located at the outermost circumferential side, a p layer 13 is formed as an inversion layer at the region of n-drift layer 2 located at an outer side than p layer 5, The application of a predetermined voltage between collector electrode 15 and emitter electrode 14a will cause the spread of a depletion layer 31 from the interface between p layer base layer 3 and n-drift layer 2 mainly towards n-drift layer 2. At this stage, the spread of the depletion layer is facilitated in the outward direction by the formation of p layer 13. Therefore, the spread of the depletion layer will be distorted in the proximity of n layer 6 located at the outer circumferential side (dotted region A). As a result, the electric field strength is increased at the outer circumferential region of the chip, leading to degradation in the breakdown voltage characteristics.

Figure 3:
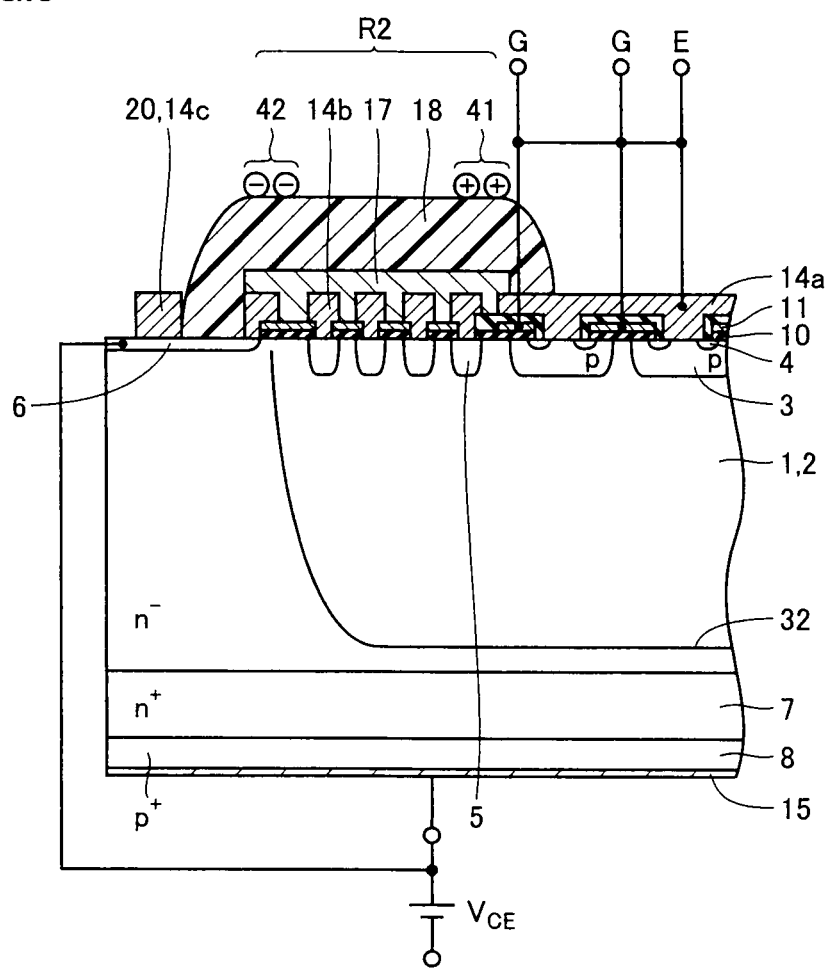

In contrast, as shown in FIG. 3, the semiconductor device of the present invention has over coat film 18 formed so as to cover semi-insulating silicon nitride film 17 in the second region where p layer 5 qualified as a guard ring is formed. Accordingly, depletion layer 32 is not readily susceptible to the polarization caused by minus ions 42 and plus ions 41, so that the depletion layer will spread without distortion. As a result, the electric field strength and breakdown voltage characteristics corresponding to the design values can be achieved.

The semiconductor device of the present embodiment also has an AlSi layer 14c of a predetermined thickness, qualified as a stepped portion 20, formed in third region R3 located outer than second region R2. Accordingly, the flow out of the applied over coat material from third region R3 towards a dicing line region located at a further outer side can be suppressed. Unfavorable dicing caused by the flow out of the over coat material to the dicing line region can be prevented.

Figure 4:
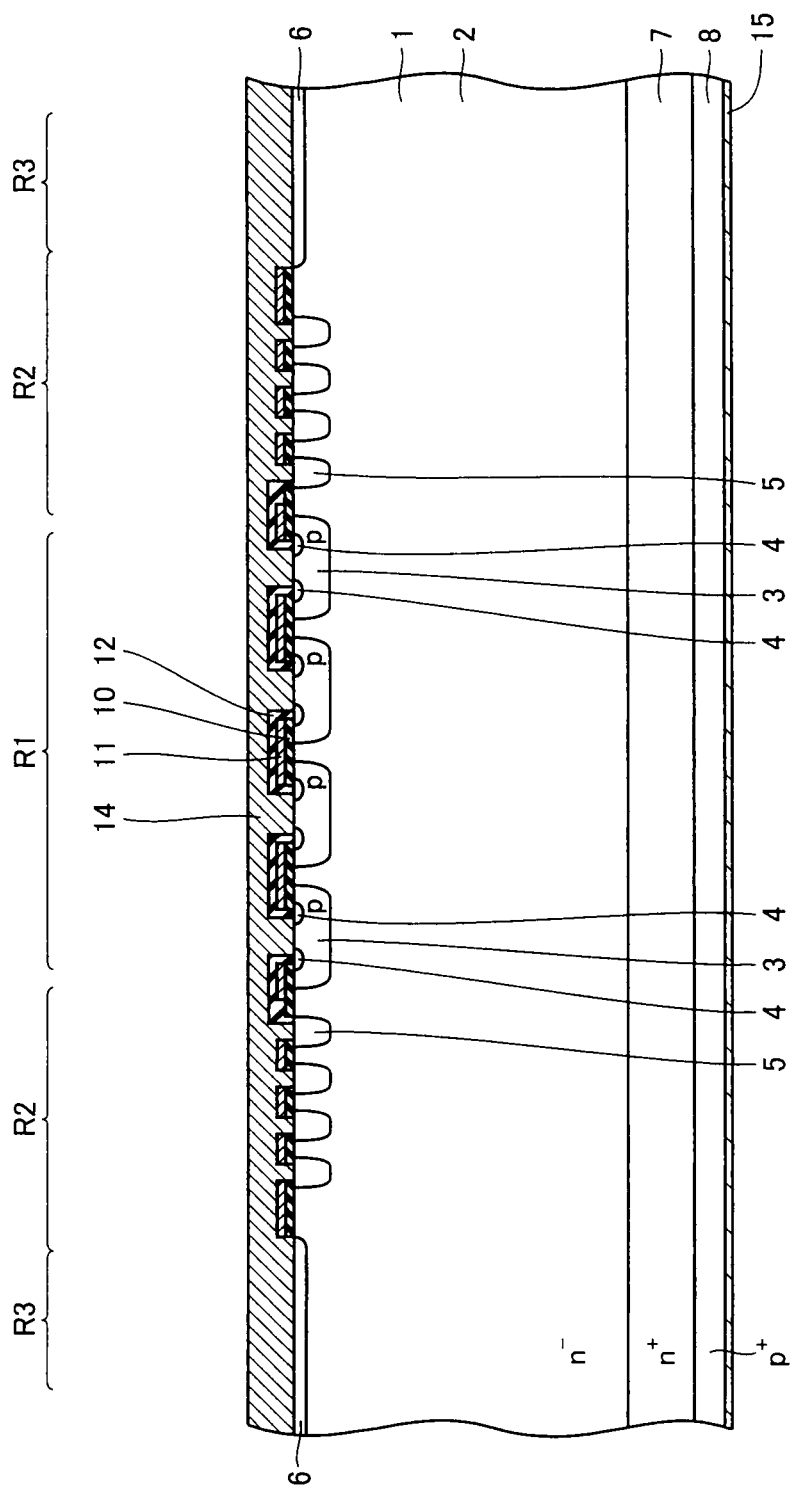
FIG. 4 is a sectional view of the semiconductor device of FIG. 1, representing a step in a fabrication method of the first embodiment.

A method of fabricating the semiconductor device set forth above will be described hereinafter. Referring to FIG. 4, p base layer 3, n source layer 4 and gate electrode 11 corresponding to an IGBT are formed in the first region at the first main surface of semiconductor substrate 1. P layer 5 qualified as a guard ring is formed in the second region located at an outer side than the first region. N layer 6 is formed in the third region located at an outer side than the second region. Then, AlSi layer 14 is formed so as to cover gate electrode 11, including interlayer insulation film 12 located on gate electrode 11. N+ buffer layer 7, p+ collector layer 8 and collector electrode 15 are formed at the second main surface of semiconductor substrate 1.

Figure 5:
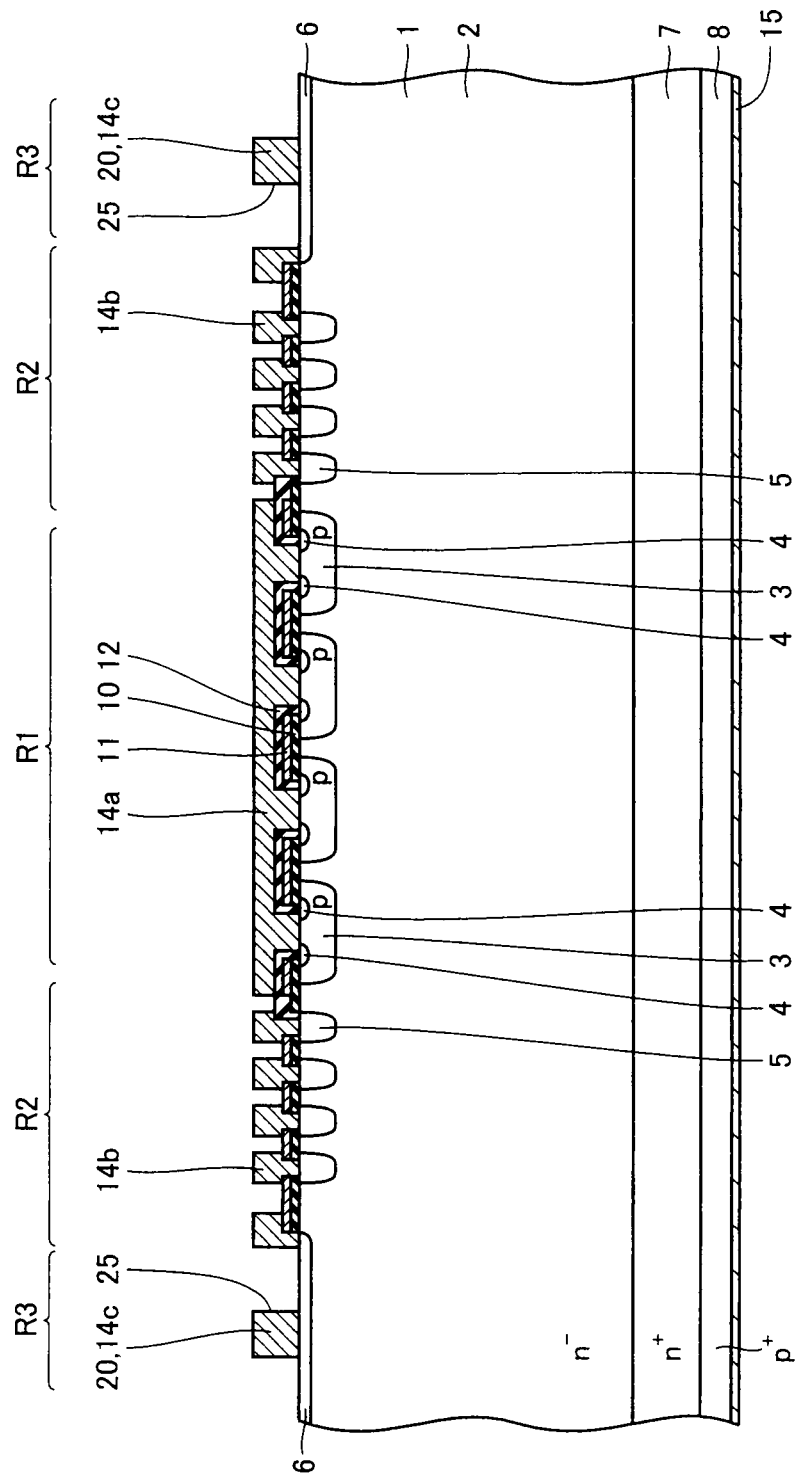
FIG. 5 is a sectional view of the semiconductor device of the first embodiment, representing a step carried out after the step of FIG. 4.

Then, a predetermined resist pattern (not shown) is formed on AlSi layer 14. Using this resist pattern as a mask, AlSi layer 14 is etched anisotropically. Accordingly, emitter electrode 14a is formed in first region R1, and AlSi layer 14b connected to p layer 5 is formed in second region R2, as shown in FIG. 5. In third region R3, AlSi layer 14c of a predetermined height is formed, serving as stepped portion 20. Then, the resist pattern is removed.

Figure 6:
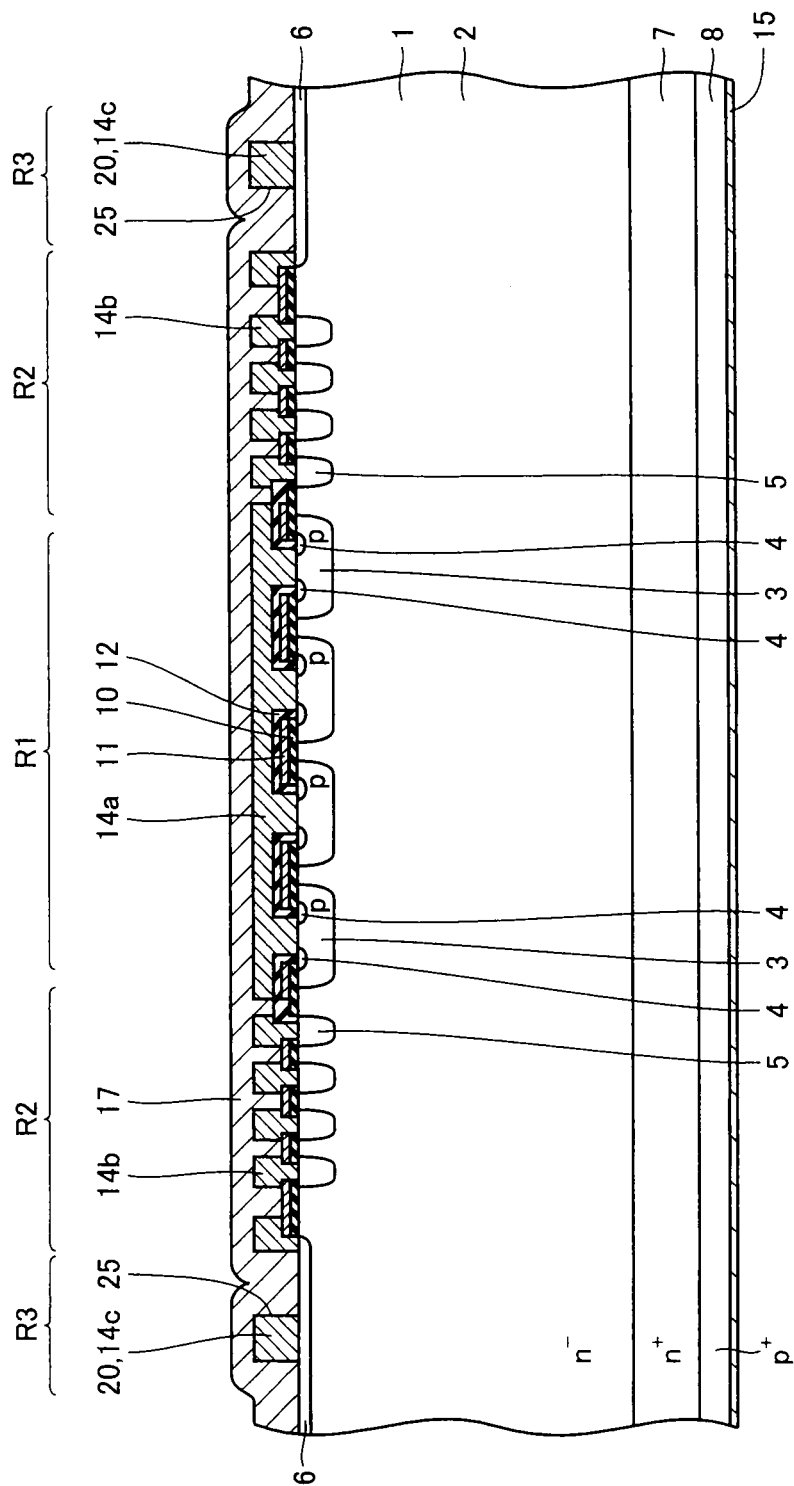
FIG. 6 is a sectional view of the semiconductor device of the first embodiment, representing a step carried out after the step of FIG. 5.
Figure 7:
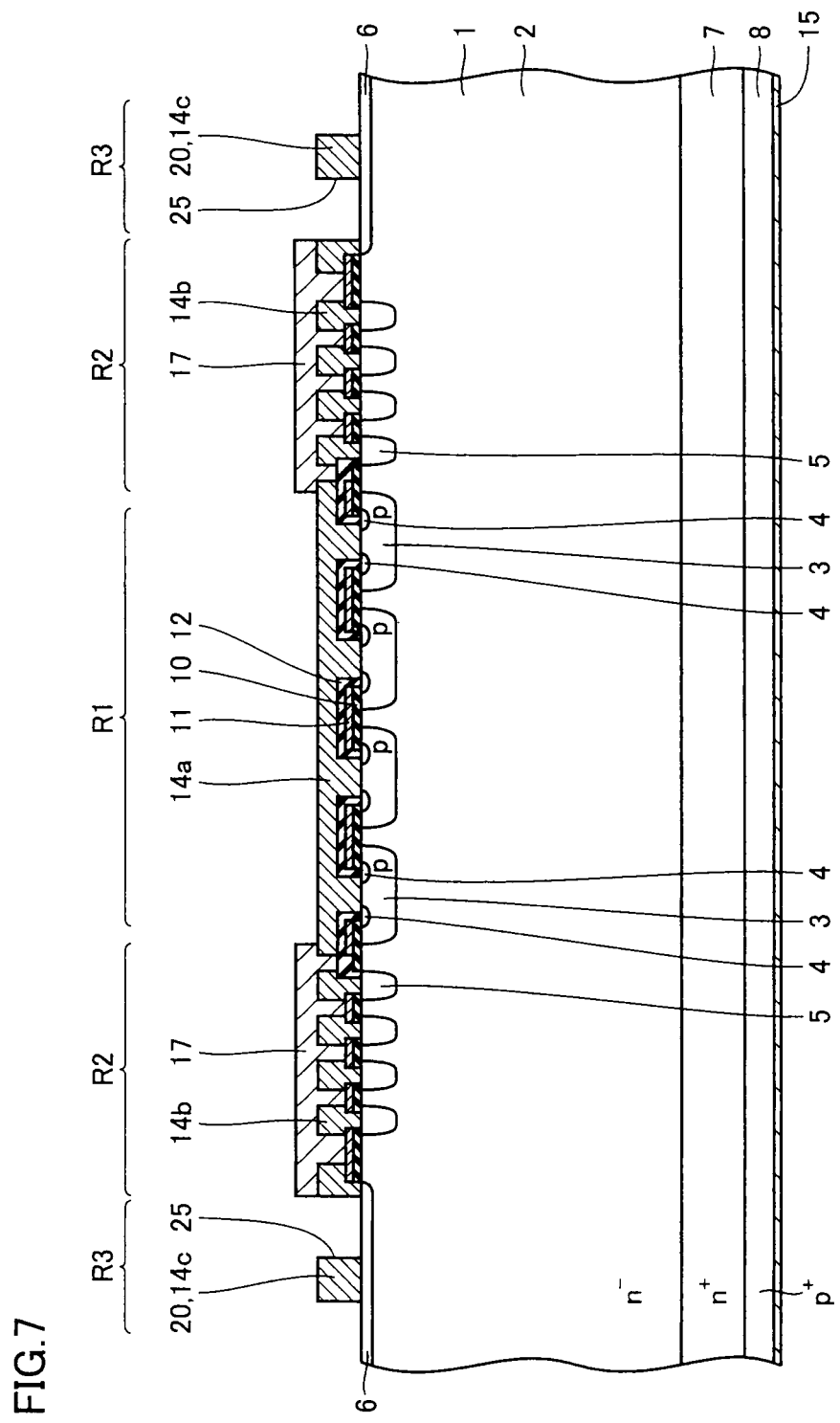
FIG. 7 is a sectional view of the semiconductor device of the first embodiment, representing a step carried out after the step of FIG. 6.

Referring to FIG. 6, semi-insulating silicon nitride film 17 is formed on the first main surface of the semiconductor substrate so as to cover emitter electrode 14a and the like. Then, a predetermined resist pattern (not shown) is formed on semi-insulating silicon nitride film 17 in a manner so as to leave the region located in second region R2. Using the provided resist pattern as a mask, semi-insulating silicon nitride film 17 is etched anisotropically, whereby semi-insulating silicon nitride film 17 located in first region R1 and third region R3 is removed, leaving the area of semi-insulating silicon nitride film 17 located in second region R2, as shown in FIG. 7. Then, the resist pattern is removed.

Figure 8:
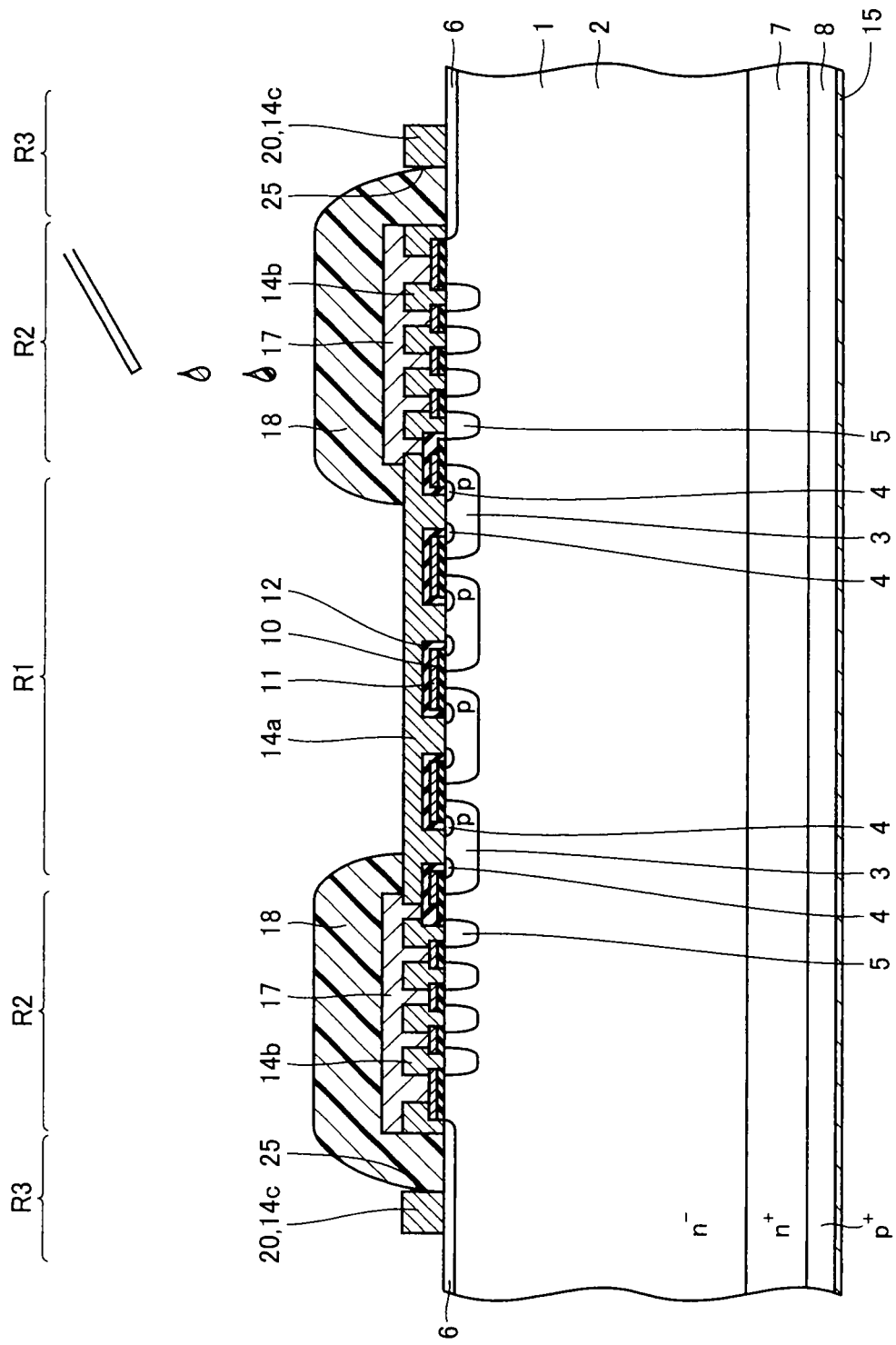
FIG. 8 is a sectional view of the semiconductor device of the first embodiment, representing a step carried out after the step of FIG. 7.

Referring to FIG. 8, an over coat material such as polyimide is applied to second region R2 at the first main surface of semiconductor substrate 1 by dipping. Thus, over coat film 18 is formed so as to cover semi-insulating silicon nitride film 17. The formation of AlSi layer 14c having a predetermined thickness prevents the applied over coat material from flowing out from third region R3 towards an outerside-located dicing line region. Accordingly, unfavorable dicing caused by the flow out of the over coat material to the dicing line region can be prevented. Over coat film 18 of the desired thickness can be formed at second region R2 to prevent degradation in the main breakdown voltage characteristics.

Figure 9:
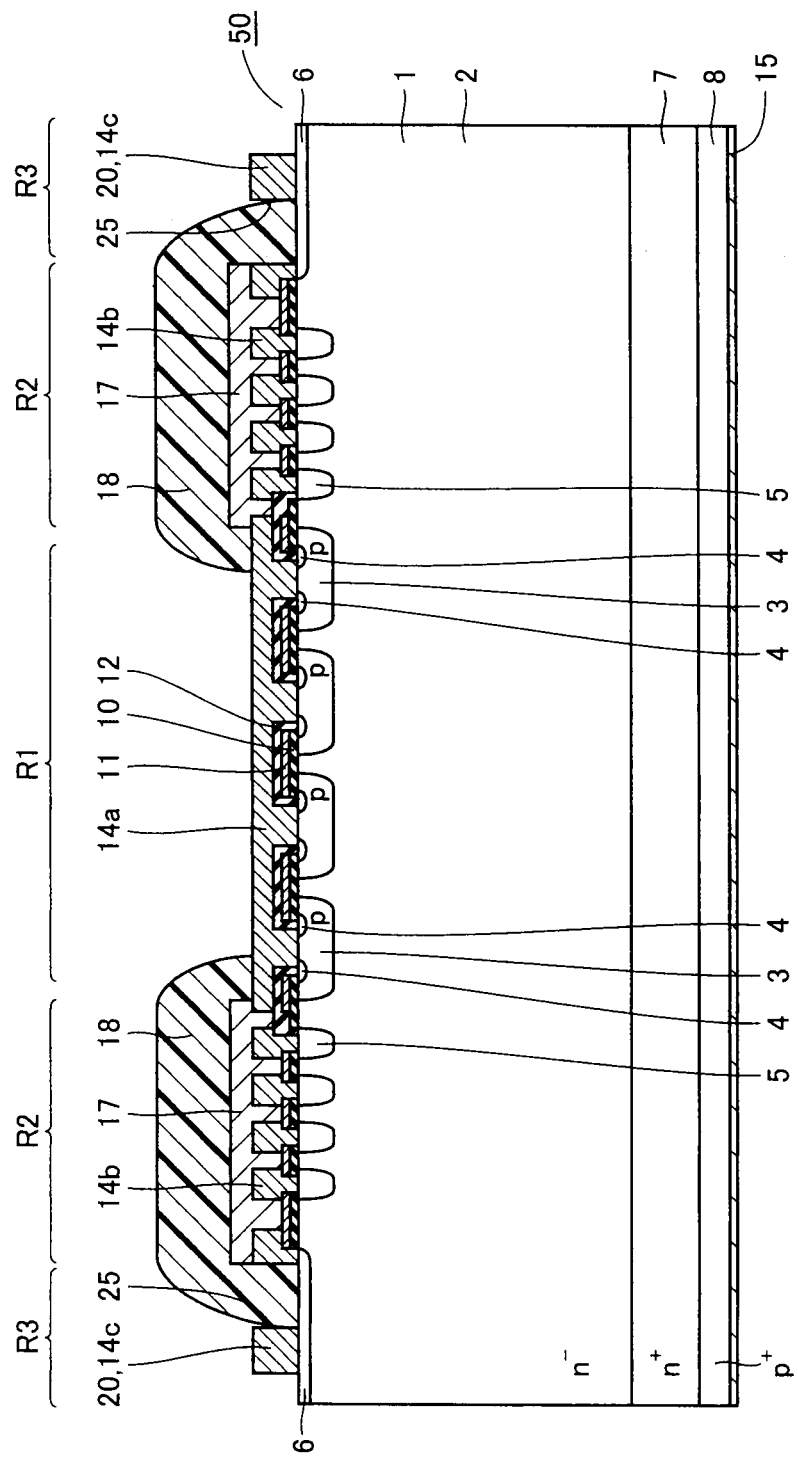
FIG. 9 is a sectional view of the semiconductor device of the first embodiment, representing a step carried out after the step of FIG. 8.
Figure 10:
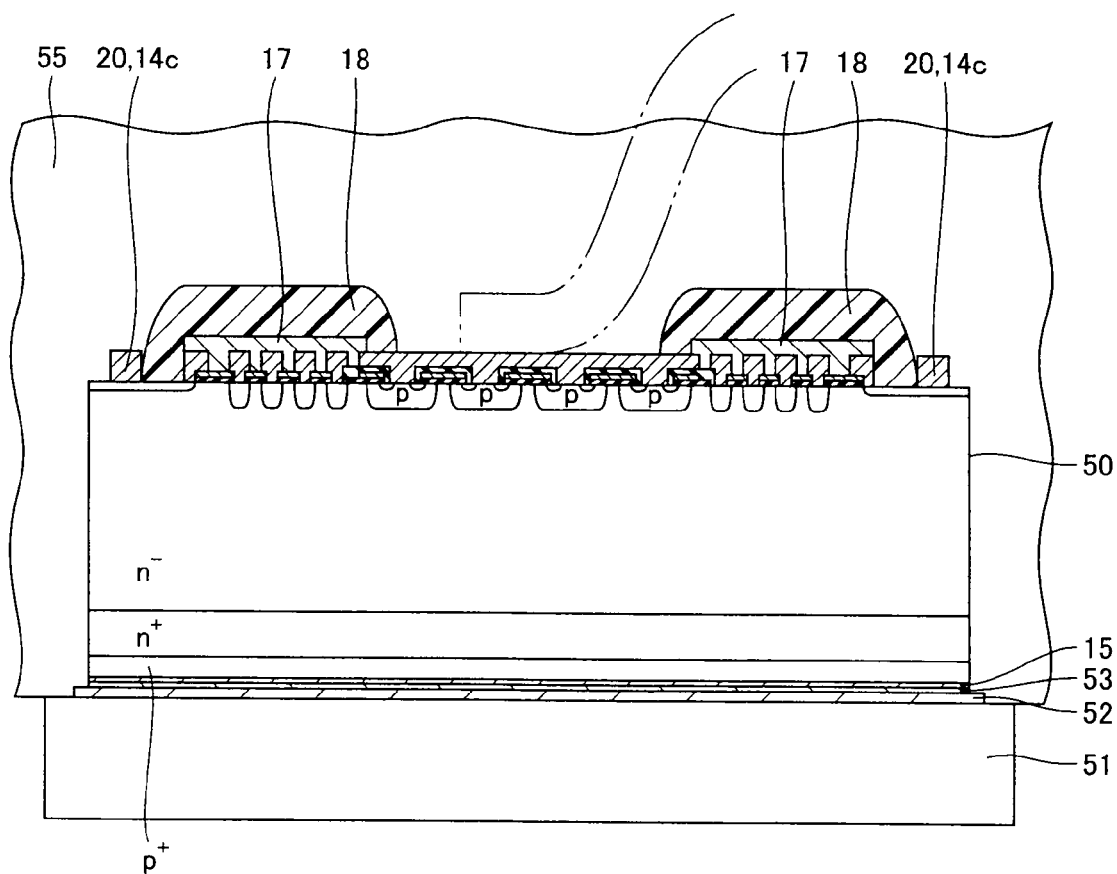
FIG. 10 is a sectional view of the semiconductor device of the first embodiment, representing a step carried out after the step of FIG. 9.

Then, as shown in FIG. 9, semiconductor substrate 1 is diced along the dicing line region to be taken out as a chip 50. Then, as shown in FIG. 10, collector electrode 15 of chip 50 is connected to a substrate electrode 52 provided at a predetermined substrate 51 by a solder 53. Chip 50 affixed to substrate 51 is sealed with a sealing gel 55. Thus, chip 50 is mounted on a predetermined substrate 51 and sealed with sealing gel 55 to be completed as a power module.

The formation of AlSi layer 14c of a predetermined thickness at the above-described semiconductor device can prevent the applied over coat material from flowing out further towards the outer side from third region R3 in the step of applying an over coat material such as polyimide. Accordingly, over coat film 18 of a desired thickness can be formed in second region R2, preventing degradation in the main breakdown voltage characteristics.

The above-described fabrication method is based on an embodiment in which an over coat material is applied prior to dicing. Alternatively, the over coat material may be applied in a chip state after dicing. This is advantageous in that the event of chip 50 not being soldered to a predetermined substrate due to the flow out of the over coat material during the step of applying the over coat material so as to run as far as to collector electrode 15 located at the back side of semiconductor substrate 1 can be prevented. There is also an advantage that, after the chip has been soldered to the substrate, the possibility of assembly failure caused by the attachment of the flowing-out over coat material to a component other than the chip can be reduced.

Figure 11:
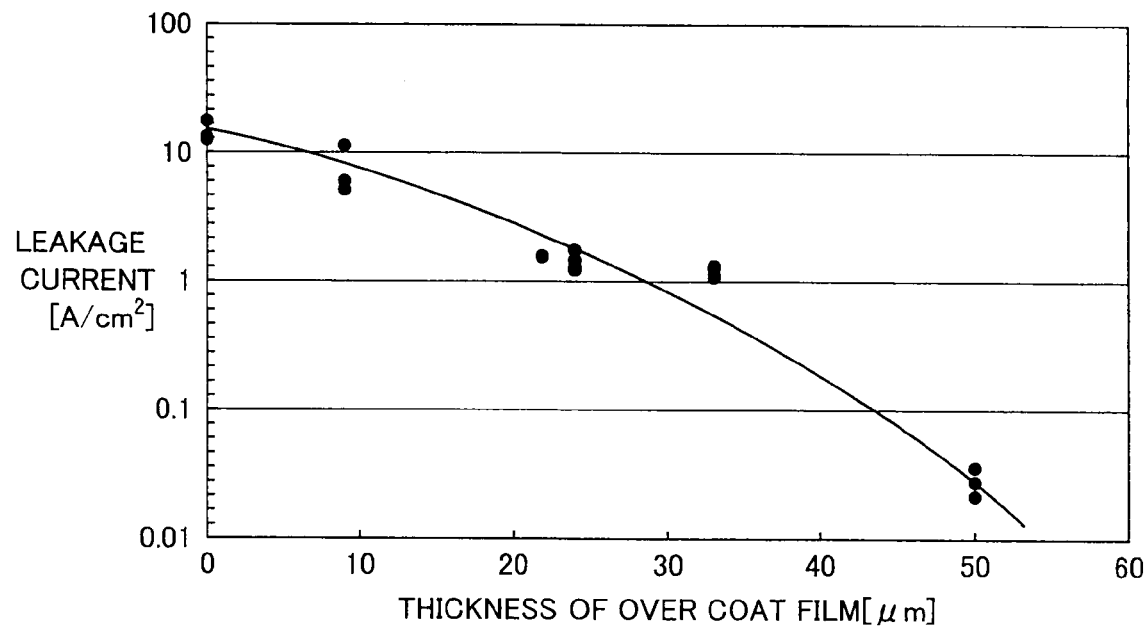
FIG. 11 is a graph representing the relationship between leakage current and the thickness of an over coat film in the first embodiment.

The inventor carried out various assessments, and found out that at least 30 μm is required for the thickness of over coat film 18 in order to achieve stable main breakdown voltage characteristics. This will be described in detail hereinafter with reference to the graph of FIG. 11 representing the dependency of the collector-emitter current ($I_{CES}$) on the thickness of the over coat film. In the IGBT of a power module, the collector-emitter current ($I_{CES}$) is preferably not more than 1 A/cm$^2$. It is therefore appreciated from the graph of FIG. 11 that at least 30 μm is required for the thickness of over coat film 18.

It is difficult to form an over coat film having a thickness of 40 μm or more based on photolithography in a general semiconductor process. Therefore, application by a dispense system is preferable, as set forth above. In addition to the dispense system, an over coat film of the desired thickness can be formed by application based on printing using a printing mask. Formation of a stepped portion 20 in the present semiconductor device to prevent flow out of an over coat material such as polyimide is advantageous in that the event of variation in main breakdown voltage characteristics, caused by the over coat film in the second region (outer circumferential junction region) R2 being partially thin due to the flow out of the over coat material, can be suppressed. An over coat film of the desired thickness can be formed with the minimum required amount of over coat material.

Figure 12:
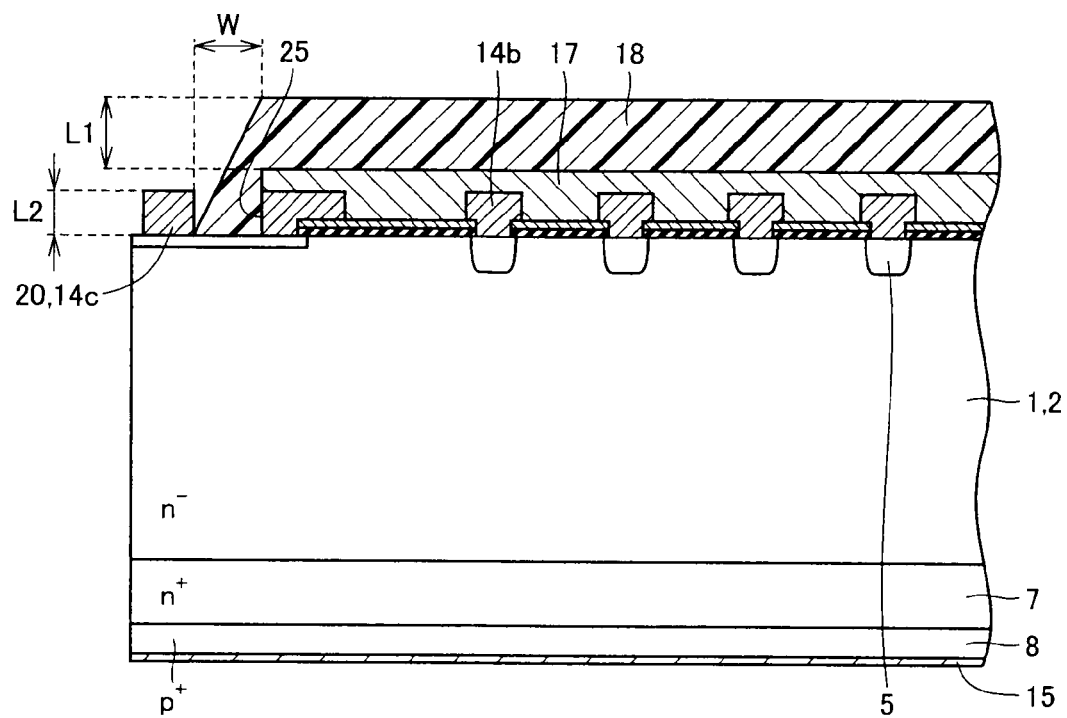
FIG. 12 is a partial sectional view of the semiconductor device of the first embodiment to describe the dimension relationship of respective elements.

For the purpose of preventing the over coat material from flowing outside of the chip, the relationship of:

$$W \geq (L1+L2)/2 \times (L1/L2)$$

is preferably satisfied, where L1 is the thickness of over coat film 18 located on the top of semi-insulating silicon nitride film 17, L2 is the height of AlSi layer 14c qualified as stepped portion 20, and W is the width of a groove 25 formed between the region of the AlSi layer located at the outermost circumferential side and AlSi layer 14c, as shown in FIG. 12. In order to prevent flow out of the over coat material, a wider width W of a groove becomes necessary as the over coat layer becomes thicker. Further, the flow out of over coat material can be prevented with a smaller width W as height L2 becomes higher.

In the above-described semiconductor device, polyimide has been cited as the material of the over coat film that covers the semi-insulating silicon nitride film. In addition to polyimide, polyamideimide, for example, or the like may be employed. Any material that has a relatively low dielectric constant such as approximately 3.5 at most can prevent the effect caused by polarization.

Second Embodiment

Figure 13:
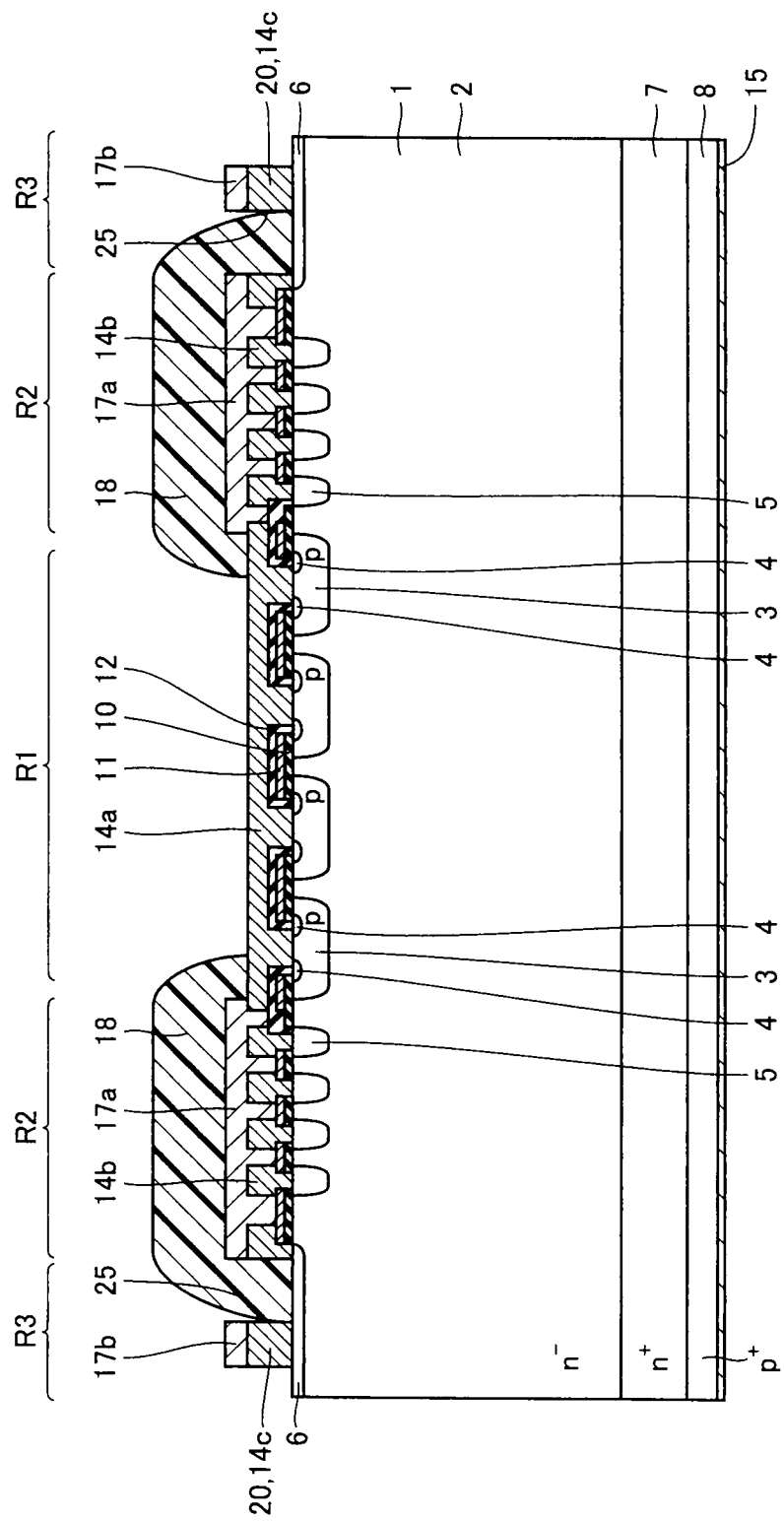
FIG. 13 is a sectional view of a semiconductor device according to a second embodiment of the present invention.

Another example of a power semiconductor device including an IGBT as a power semiconductor element will be described hereinafter. As shown in FIG. 13, a semi-insulating silicon nitride film 17b (e.g., a second stepped portion) is formed on the top face of AlSi layer 14c qualified as a stepped portion 20 (e.g., a first stepped portion), located in third region R3, in addition to semi-insulating silicon nitride film 17a that covers AlSi layer 14b located in second region R2. The remaining elements are similar to those of the semiconductor device of FIG. 1. The same or likewise elements have the same reference characters allotted, and description thereof will not be repeated.

Figure 14:
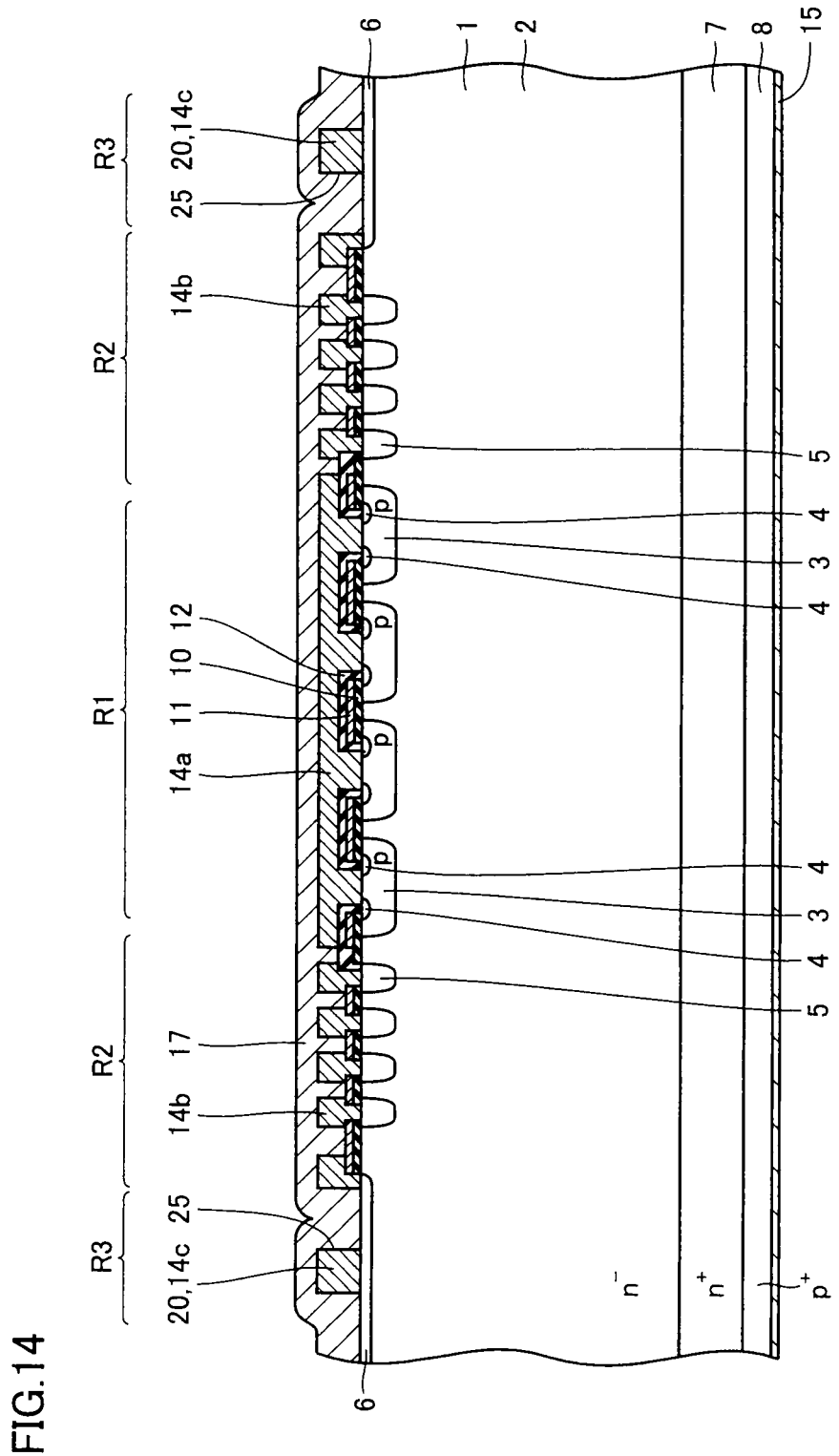
FIG. 14 is a sectional view of the semiconductor device of FIG. 13, representing a step in a fabrication method of the second embodiment.

A fabrication method of the semiconductor device of the second embodiment will be described hereinafter. Following steps similar to those shown in FIGS. 4 and 5, semi-insulating silicon nitride film 17 is formed on the first main surface of semiconductor substrate 1 so as to cover emitter electrode 14a and the like, as shown in FIG. 14. Then, a predetermined resist pattern (not shown) is formed at the surface of semi-insulating silicon nitride film 17, leaving out the region of semi-insulating silicon nitride film 17 located above AlSi layer 14c.

Figure 15:
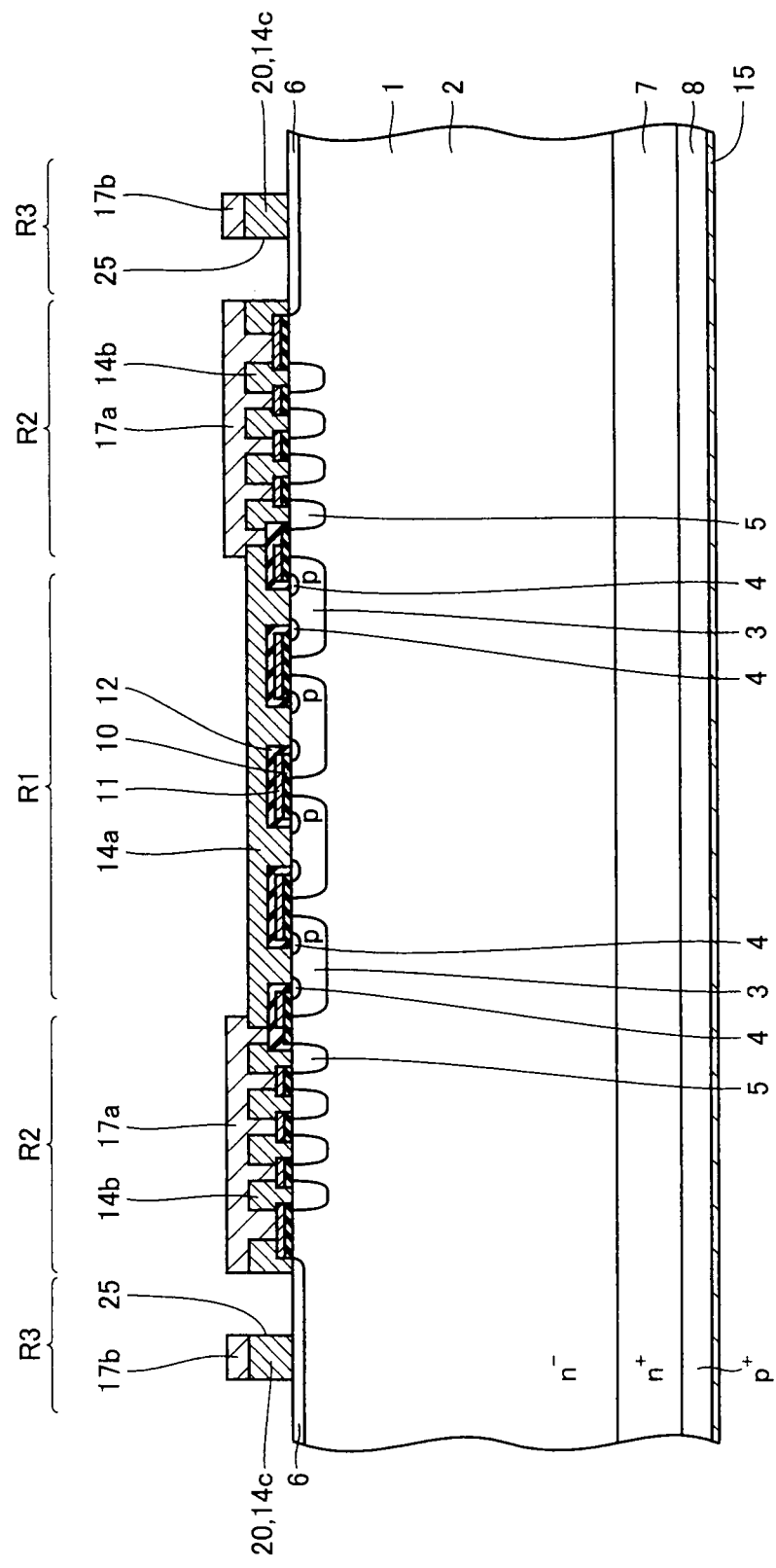
FIG. 15 is a sectional view of the semiconductor device of the second embodiment, representing a step carried out after the step of FIG. 14.

Using this resist pattern as a mask, semi-insulating silicon nitride film 17 is etched anisotropically, so that the region of semi-insulating silicon nitride film 17 located in first region R1 and the like is removed, leaving semi-insulating silicon nitride film 17a located in second region R2 and semi-insulating silicon nitride film 17b located on the top face of AlSi layer 14c in third region R3, as shown in FIG. 15. Then, this resist pattern is removed.

Figure 16:
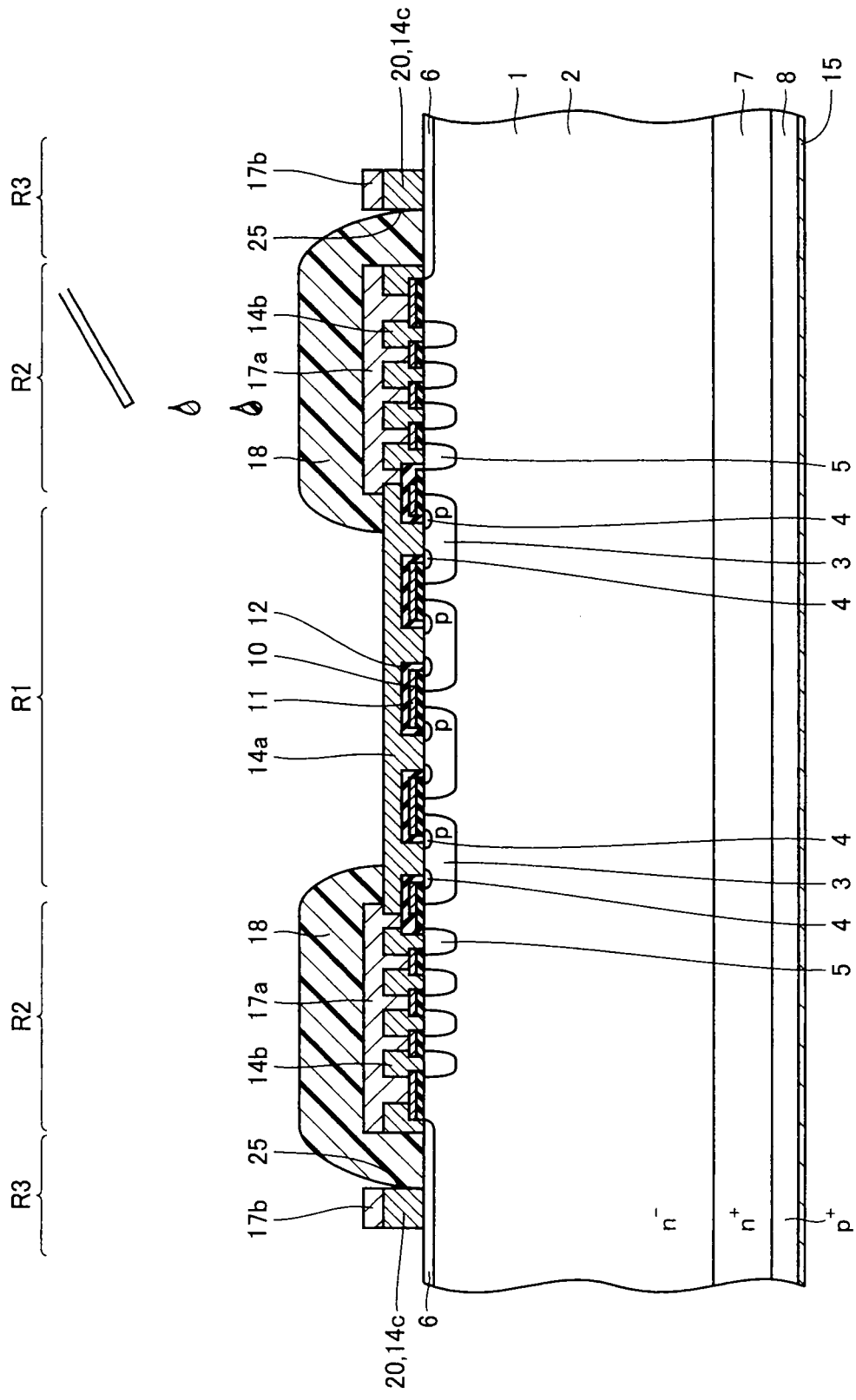
FIG. 16 is a sectional view of the semiconductor device of the second embodiment, representing a step carried out after the step of FIG. 15.

As shown in FIG. 16, an over coat material such as polyimide is applied to second region R2 at the first main surface of semiconductor substrate 1 by a dipping scheme, whereby over coat film 18 is formed so as to cover semi-insulating silicon nitride film 17a. The formation of AlSi layer 14c having a predetermined thickness at this stage can prevent the applied polyimide from flowing out towards the dicing line region from third region R3.

Figure 17:
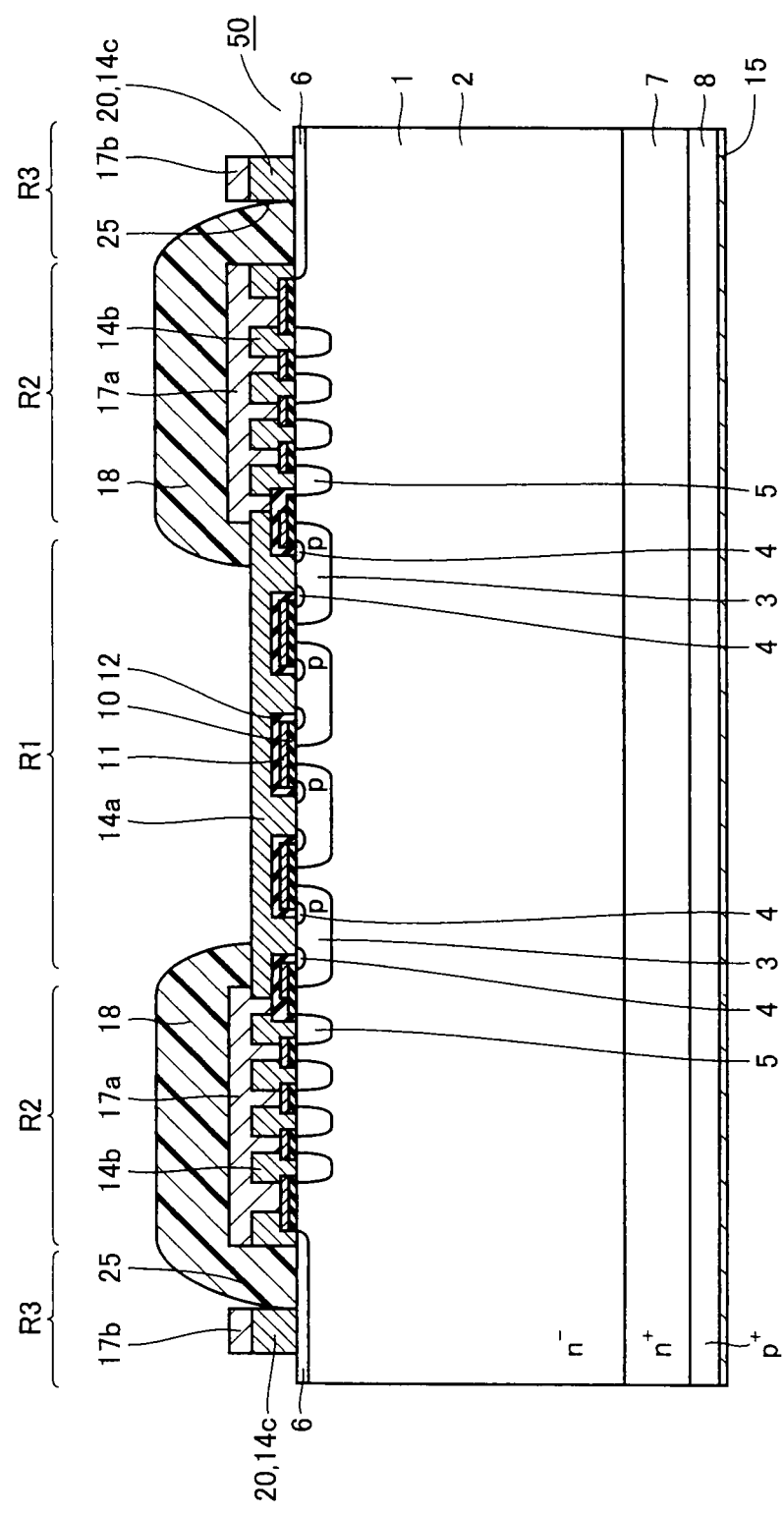
FIG. 17 is a sectional view of the semiconductor device of the second embodiment, representing a step carried out after the step of FIG. 16.

Then, referring to FIG. 17, semiconductor substrate 1 is diced along the dicing region to be taken out as a chip 50. Then, a step similar to that shown in FIG. 10 is carried out. The chip is affixed to a predetermined substrate and sealed with a sealing gel to be completed as a power module (not shown).

Figure 18:
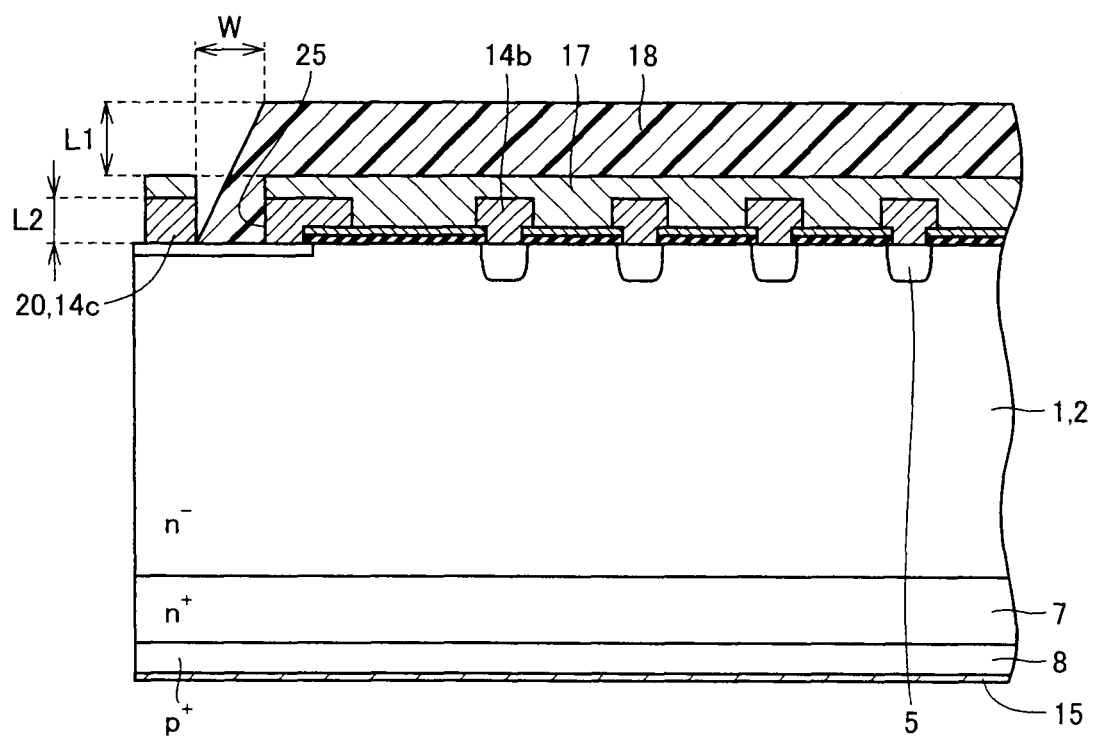
FIG. 18 is a partial sectional view of the semiconductor device of the second embodiment to describe the dimension relationship of respective elements.

Likewise with the above-described semiconductor device, formation of AlSi layer 14c having a predetermined thickness in the present semiconductor device can prevent the applied over coat material from flowing outwards from third region R3 during the step of applying a polyimide over coat material. Namely, as shown in FIG. 18, the relationship of:

$$W \geqq (L1+L2)/2 \times (L1/L2)$$

is satisfied, where L1 is the thickness of over coat film 18 located on the top face of semi-insulating silicon nitride film 17, L2 is the height of AlSi layer 14c, and W is the width of the groove formed between the region of the AlSi layer located at the outermost circumferential side and AlSi layer 14c. Accordingly, the flow out of the over coat material outside of the chip can be prevented and over coat film 18 of the desired thickness can be formed in second region R2, preventing degradation in the main breakdown voltage characteristics.

Particularly in the present semiconductor device, semi-insulating silicon nitride film 17b is additionally formed on the top face of AlSi layer 14c that is a stepped portion 20. Accordingly, the flow out of the applied over coat material from third region R3 can be prevented reliably.

Although each semiconductor device set forth above is based on an embodiment in which an IGBT is employed as the power semiconductor element, an element such as a diode may be employed, in addition to an IGBT.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
   a semiconductor substrate of a first conductivity type, including a first main surface extending in a first direction, and a second main surface opposing the first main surface in a second direction perpendicular to the first direction,
   a power semiconductor element including a first electrode formed in a first region at said first main surface of said semiconductor substrate, and a second electrode formed at said second main surface,
   a guard ring of a second conductivity type, formed in a second region at said first main surface, located at a more outer circumference of said first main surface than said first region,
   a semi-insulating insulation film formed to cover said second region,
   a dielectric film formed in said second region to cover said semi-insulating insulation film in the second direction, and
   a stepped portion formed in a third region at said first main surface, located at a more outer circumference of said first main surface than said second region, to prevent a flow of said dielectric film, a nearest portion of said stepped portion to said first electrode being farther from said first electrode than is a farthest portion of said semi-insulating insulation film from said first electrode.

2. The semiconductor device according to claim 1, wherein said dielectric film has a thickness of at least 30 μm.

3. The semiconductor device according to claim 1, wherein said stepped portion is formed of a same layer as said first electrode.

4. The semiconductor device according to claim 3, further comprising:
   a second stepped portion located on said stepped portion, formed of a same layer as said semi-insulating insulation film.

5. The semiconductor device according to claim 1, further comprising:
   a groove provided between said stepped portion and said second region, and set such that a relationship of:

$$W \geqq (L1+L2)/2 \times (L1/L2)$$

is satisfied, where L1 is a thickness of said dielectric film, L2 is a height of said stepped portion, and W is a width of said groove.

6. The semiconductor device according to claim 1, wherein the semiconductor device is an insulated gate bipolar transistor.

7. The semiconductor device according to claim 1, wherein the dielectric film contacts said first main surface between said semi-insulating insulation film and stepped portion.

8. The semiconductor device according to claim 1, wherein the dielectric film is polyimide or polyamideimide.

9. The semiconductor device according to claim 1, wherein the dielectric film is applied to said second region by dipping or printing using a printing mask.

10. A semiconductor device, comprising:
    a semiconductor substrate of a first conductivity type, including a first main surface extending in a first direction, and a second main surface opposing the first main surface in a second direction perpendicular to the first direction;
    a power semiconductor element including a first electrode in a first region at said first main surface of said semiconductor substrate, and a second electrode at said second main surface;
    a guard ring of a second conductivity type, in a second region at said first main surface, at a more outer circumference of said first main surface than said first region;
    a semi-insulating insulation film covering said second region;
    a dielectric film in said second region covering said semi-insulating insulation film in the second direction; and means for preventing a flow of said dielectric film, the means being in a third region at said first main surface at a more outer circumference of said first main surface than said second region, a nearest portion of said means to said first electrode being farther from said first electrode than is a farthest portion of said semi-insulating insulation film from said first electrode.

11. The semiconductor device according to claim 10, wherein said means includes a stepped portion and a groove provided between said stepped portion and said second region, a width W of said groove satisfying $$W \geqq (L1+L2)/2 \times (L1/L2),$$

where L1 is a thickness of said dielectric film and L2 is a height of said stepped portion.

* * * * *